United States Patent
Schmidt et al.

(10) Patent No.: US 8,815,375 B2
(45) Date of Patent: Aug. 26, 2014

(54) SUPPORT FOR ELECTRONIC CIRCUITS

(75) Inventors: Wolfgang Schmidt, Georgsmarienhutte (DE); Kirsten Barth-Gremmel, Cologne (DE)

(73) Assignee: Schoeller Technocell GmbH & Co. KG, Osnabruck (DE)

( * ) Notice: Subject to any disclaimer, the term of this patent is extended or adjusted under 35 U.S.C. 154(b) by 106 days.

(21) Appl. No.: 13/395,659

(22) PCT Filed: Sep. 9, 2010

(86) PCT No.: PCT/EP2010/063222
§ 371 (c)(1),
(2), (4) Date: May 25, 2012

(87) PCT Pub. No.: WO2011/029865
PCT Pub. Date: Mar. 17, 2011

(65) Prior Publication Data
US 2012/0234585 A1     Sep. 20, 2012

Related U.S. Application Data

(60) Provisional application No. 61/242,887, filed on Sep. 16, 2009.

(30) Foreign Application Priority Data

Sep. 14, 2009 (DE) .......................... 10 2009 041 095

(51) Int. Cl.
| | | |
|---|---|---|
| B41M 5/00 | (2006.01) | |
| B44C 1/17 | (2006.01) | |
| G03G 7/00 | (2006.01) | |
| B41M 5/52 | (2006.01) | |
| B41M 5/50 | (2006.01) | |

(52) U.S. Cl.
CPC ............... *B41M 5/5218* (2013.01); *B41M 5/52* (2013.01); *B41M 5/506* (2013.01); *B41M 5/5254* (2013.01); *H05K 2201/0209* (2013.01); *H05K 2201/05* (2013.01); *Y10S 428/901* (2013.01)
USPC .................. 428/195.1; 428/32.21; 428/32.31; 428/32.32; 428/32.34; 428/901

(58) Field of Classification Search
CPC ...... B41M 5/5218; B41M 5/52; B41M 5/506; B41M 5/5254; H05K 2201/0209; H05K 2201/05
USPC .......... 428/32.21, 32.31, 32.32, 32.34, 195.1, 428/901
See application file for complete search history.

(56) References Cited

U.S. PATENT DOCUMENTS

| | | | |
|---|---|---|---|
| 3,652,332 A | | 3/1972 | Brand et al. |
| 2002/0037395 A1 * | | 3/2002 | Zhong et al. .................. 428/195 |
| 2003/0072925 A1 * | | 4/2003 | Kiyama et al. ................ 428/195 |
| 2003/0213614 A1 * | | 11/2003 | Furusawa et al. ............. 174/256 |
| 2005/0121675 A1 | | 6/2005 | Maekawa et al. |
| 2007/0231511 A1 * | | 10/2007 | Okuda et al. ................ 428/32.34 |
| 2008/0124456 A1 * | | 5/2008 | Satou et al. .................. 427/99.4 |
| 2009/0087548 A1 | | 4/2009 | Kim et al. |

FOREIGN PATENT DOCUMENTS

| | | |
|---|---|---|
| EP | 0252451 | 1/1988 |
| EP | 1544905 | 6/2005 |
| EP | 1926357 | 5/2008 |
| JP | 2004-006578 | 1/2004 |
| JP | 2005-159324 | 6/2005 |
| JP | 2007-116103 | 5/2007 |
| JP | 2008-004375 | 1/2008 |
| JP | 2008-149311 | 7/2008 |
| JP | 2008-283008 | 11/2008 |
| JP | 2009-030049 | 2/2009 |
| WO | WO2004030072 | 4/2004 |
| WO | WO2007065841 | 6/2007 |

OTHER PUBLICATIONS

"Low Temperature Chemical Post-treatment of Inkjet-printed Nanoparticle Silver Inks" (NIP 24 and Digital Fabrication 2008 Final Program and Proceedings, p. 907).

Blum, John B. "Printed Circuit Design and Manufacture", Oct. 1, 2007.

* cited by examiner

*Primary Examiner* — Betelhem Shewareged
(74) *Attorney, Agent, or Firm* — Honigman Miller Schwartz & Cohn, LLP; Thomas A. Wootton; Jonathan P. O'Brien

(57) ABSTRACT

Support materials for printing electrically conductive structures by means of inkjet printing with inks which contain conductive particles lead to low resistances for the printed structures without thermal post-treatment when they contain a microporous layer with a mean pore size of less than 100 nm as an outer layer.

17 Claims, No Drawings

SUPPORT FOR ELECTRONIC CIRCUITS

This application is the U.S. National Phase of PCT Application Serial No. PCT/EP2010/063222, filed Sep. 9, 2010, which claims the priority of German Application Serial No. 102009041095.3, filed Sep. 14, 2009 and U.S. Provisional Application No. 61/242,887, filed Sep. 16, 2009, all of which are incorporated herein by reference in their entirety.

FIELD OF THE INVENTION

The invention relates to a support material for printing electronic circuits by means of the inkjet printing process with electrically conductive inks.

TECHNICAL BACKGROUND OF THE INVENTION

An essential step in the production of electronic devices and circuits is the manufacture of conductive connections between the components. These connections must follow a predetermined structure in order that the componentry or the device can carry out its intended function. Such structures can be manufactured from conductive materials in a variety of manners, usually from metals or carbon (graphite). Printing processes are particularly suitable for cheap mass production, whereby the circuits are produced by depositing printing inks which contain the conductive materials onto flat electrically insulating, preferably flexible support materials in a single operational step.

When manufacturing electronic circuits, inkjet printing technology can be employed. This means that electrically conductive structures can be deposited on insulating support materials, or components which have already been deposited can be conductively connected, whereby in contrast to other printing techniques such as screen printing, a previously prepared printing mask does not have to be produced; thus, it is possible to carry out manufacturing on a small mass-production scale, or even to manufacture single parts, simply and cheaply. Such applications have been described, for example, in the article by John B Blum, "Printed Circuit Design and Manufacture", 1 Oct. 2007.

Metal-containing or carbon-containing preparations are usually employed as printing inks; the electrically conductive material is present therein in the form of particles. For inkjet printing, such particles must have very small dimensions, usually less than 1 µm, in order to prevent the printing nozzles from becoming blocked and to prevent the conductive particles from sedimentation in the low-viscosity ink. In order to stabilize the particles against agglomeration and sedimentation, such inks also have to be supplemented with additives such as surfactants or protective colloids, for example. Inks which contain finely divided metallic silver are frequently preferred. Inks of that type are, for example, available from ANP (Advanced Nano Products) in Korea under reference DGP and DGH, from Harima Chemicals Inc, Japan under reference NPS and from Cabot Corporation, USA, under reference CCI-300. The particle size of the silver particles in those inks is in the range from 5 nm to a few hundred nm.

In addition to using rigid support materials such as glass or ceramic as the support materials to be printed, flexible films formed from polymers, in particular polyesters, are preferably employed. Following inkjet printing on such support materials, the solvent contained in the ink evaporates and the non-volatile additives as well as the silver particles remain in the printed layer. Since the additives are electrical insulators, the conductivity of such printed structures is low. For this reason, as described in the data sheets from the ink manufacturers and in the article by John B Blum, "Printed Circuit Design and Manufacture", 1 Oct. 2007, a thermal post-treatment is necessary at temperatures of at least 100° C. to over 400° C. in order to produce a metallic conductivity in the printed structures. Particularly at low temperatures, the time required for this necessary thermal post-treatment is long, normally more than 1 hour. If higher temperatures are employed in order to reduce the treatment time, however, it is not possible to use the cheap and easily manipulatable flexible films produced from thermoplastic polymers as a support material since the stability of such foils at the high temperatures required is insufficient and they deform.

In the article "Low Temperature Chemical Post-treatment of Inkjet-Printed Nano-Particle Silver Inks" (NIP 24 and Digital Fabrication 2008 Final Program and Proceedings, page 907), Werner Zapka et al describe a process wherein the printed structures are treated with a salt solution following drying. Following use, however, that salt solution has to be removed by washing again, thereby constituting a multi-step process with subsequent repeated drying.

U.S. Pat. No. 3,652,332 A describes the use of porous support materials, in particular coated offset printing paper, to print conductive structures. The printing process used in that case is the letterpress process. The printing inks described for producing the conductive structures are carbon black or flake silver printing inks with particle sizes of distinctly more than 1 µm, which are unsuitable for the inkjet printing process. That patent teaches that the printing medium must have a certain absorbency in order to be able to produce homogeneous printing surfaces with reproducible electrical conductivity. The support materials described in the patent, preferably standard graphical papers coated with clay pigment, do not, however, satisfy the special requirements of inkjet printing with low-viscosity inks containing conductive particles, since they have a coarse and irregular pore structure and low porosity.

US 2009/0087548 A1 describes a process whereby a metallic ink is applied to a support material having a porous layer. The porous layer prevents the printed structures from spreading, so that very fine structures are obtained. In that process, the metal particles enter the porous layer; the porous layer is then removed in the subsequent heat treatment. Even though very high resolution structures can be printed using that process, a subsequent additional process step for removing the porous layer is required. In addition, that process step involves the use of high temperatures of 300° C., which means that the invention cannot be applied to the preferred flexible support materials.

SUMMARY OF THE INVENTION

The object of the invention is to provide a support material for printing electronic circuits using printing inks, which contain electrically conductive particles having a mean particle size of less than 1 µm. It endows the printed structures with high electric conductivity even without thermal post-treatment of the printed material. This support material is especially suitable for inkjet printing with metal or carbon (graphite)-containing inks and means that high resolution printing of fine structures can be carried out.

It has now surprisingly been discovered that the thermal post-treatment of inkjet-printed structures of conductive particles can be dispensed with when the support material contains an outer microporous layer which has a mean pore size of less than 100 nm.

The invention also pertains to a process for producing an electrically conductive structure on the support material described above.

Finally, the invention pertains to a printed circuit, manufactured by printing the support material defined above using a printing ink containing electrically conductive particles using the inkjet printing process.

DETAILED DESCRIPTION OF PREFERRED EMBODIMENTS

In a preferred embodiment of the invention, the microporous layer has a mean pore size in the range 5 nm to 50 nm.

Particularly preferably, moreover, the surface of the microporous layer has a mean roughness of less than 1 µm, measured as the Rz parameter in accordance with DIN 4768.

In a particular embodiment of the invention, the outer microporous layer may be a polymer foam manufactured, for example, using a sol-gel process. Examples of such microporous layers have been described in WO 2007/065841 A1.

In a further preferred embodiment of the invention, the outer microporous layer contains fine inorganic and/or organic pigment particles and a hydrophilic binding agent. Examples of pigments which in the context of the invention are suitable for the microporous layer are aluminium oxide, aluminium hydroxide, aluminium oxide hydroxide, aluminium oxide hydrate, silicon dioxide, magnesium hydroxide, kaolin, titanium dioxide, zinc oxide, zinc hydroxide, calcium silicate, magnesium silicate, calcium carbonate, magnesium carbonate and barium sulphate. The quantity of pigments in the microporous layer may be 40% to 95% by weight, preferably 60% to 90% by weight, with respect to the weight of the dried layer.

The particle size of the pigment in the microporous layer is preferably less than 1000 nm, but in particular 50 to 500 nm. The mean particle size of the primary particles is preferably less than 100 nm, in particular less than 50 nm.

The microporous layer contains a water-soluble and/or water-dispersible binding agent. Examples of suitable binding agents are polyvinyl alcohol, completely or partially saponified, cationically modified polyvinyl alcohol, polyvinyl alcohol containing silyl groups, polyvinyl alcohol containing acetal groups, gelatine, polyvinyl pyrrolidone, starch, carboxymethylcellulose, polyethylene glycol, styrene/butadiene latex and styrene/acrylate latex. Particularly preferably, completely or partially saponified polyvinyl alcohols are used. The quantity of binding agent may be 60% to 5% by weight, preferably 50% to 10% by weight, in particular however 35% to 8% by weight, with respect to the weight of the dried layer.

The microporous layer can contain the usual additives and auxiliary substances such as cross-linking agents, ionic and/or non-ionic surfactants, particle-binding substances such as polyammonium compounds, UV absorbers, antioxidants and other light stabilizing and gas resistance improving substances as well as other auxiliary substances.

The coat weight for the microporous layer may be 1 to 60 g/m$^2$, preferably 5 to 40 g/m$^2$, particularly preferably 10 to 30 g/m$^2$.

The microporous layer can be formed as a single layer or in multiple layers.

The base material used as the support material over which the microporous layer is arranged can be a rigid flat material such as glass or a plastic. Preferably, however, a flexible base material is used, such as a plastic film, non-woven material or paper.

In a particularly preferred embodiment, the base material is a base paper. The term "base paper" as used in the context of the invention means an uncoated or surface-sized paper. As well as containing fibres of cellular material, a base paper can contain sizing agents such as alkyl ketene dimers, fatty acids and/or fatty acid salts, epoxided fatty acid amides, alkenyl or alkylsuccinic acid anhydride, wet-strength agents such as polyamine-polyamide-epichlorhydrin, dry strength agents such as anionic, cationic or amphoteric polyamides, optical brighteners, pigments, colorants, defoaming agents and other auxiliary substances which are known in the paper industry.

The base paper may be surface-sized. Examples of sizing agents which are suitable for this purpose are polyvinyl alcohol or oxidized starch. The base paper may be produced on a Fourdrinier or Yankee paper machine (roll paper machine). The grammage of the base paper may be from 50 to 250 g/m$^2$, in particular 50 to 150 g/m$^2$. The base paper may be used in the uncalendered or calendered (smoothed) form.

Particularly suitable base papers are those with a density of 0.8 to 1.05 g/cm$^3$, in particular 0.95 to 1.02 g/cm$^3$.

Examples of fillers which may be used in base paper are kaolins, calcium carbonate in its natural form such as lime, marble or dolomite, precipitated calcium carbonate, calcium sulphate, barium sulphate, titanium dioxide, talc, silica, aluminium oxide and mixtures thereof.

In a further embodiment of the invention, at least one further layer may be arranged between the base paper and the microporous layer, which further layer contains a hydrophilic binding agent. Particularly suitable examples for this purpose are film-forming starches such as heat-modified starches, in particular corn starches or hydroxypropylated starches. In a preferred form of the invention, low-viscosity starch solutions are used which have Brookfield viscosities in the range 50 to 600 mPas (25% solution, 50° C./100 Upm), in particular 100 to 400 mPas, preferably 200 to 300 mPas. The Brookfield viscosity is measured in accordance with International standard ISO 2555. Preferably, the binding agent does not contain any synthetic latex. The absence of a synthetic binding agent means that waste can be re-utilized without having to be worked up.

In a further embodiment of the invention, at least one pigment is contained in the further layer containing a hydrophilic binding agent. The pigment may be selected from the group formed by metal oxides, silicates, carbonates, sulphides and sulphates. Pigments such as kaolin, talc, calcium carbonate and/or barium sulphate are particularly suitable.

A pigment with a narrow grain size distribution, wherein the dimension of at least 70% of the pigment particles is of less than 1 µm, is particularly preferred. In order to achieve the effect of the invention, the proportion of pigment with the narrow grain size distribution should be at least 5% by weight, in particular 10% to 90% by weight of the total quantity of pigment. Particularly good results are obtained with a proportion of 30% to 80% by weight of the total pigment weight.

A pigment with a narrow grain size distribution in accordance with the invention also comprises pigments with a grain size distribution whereby the dimension of at least approximately 70% by weight of the pigment particles is less than approximately 1 µm, and for 40% to 80% of these pigment particles, the difference between the pigment with the largest grain size (diameter) and the pigment with the smallest grain size is less than approximately 0.4 µm. Particularly preferably, this is a calcium carbonate with a $d_{50\%}$ of approximately 0.7 µm.

In a particular embodiment of the invention, a pigment mixture can be used which consists of the calcium carbonate defined above and kaolin. The calcium carbonate/kaolin proportion is preferably 30:70 to 70:30.

The binding agent/pigment proportion in the layer may be from 0.1 to 2.5, preferably 0.2 to 1.5, but in particular it is approximately 0.9 to 1.3.

The layer containing a hydrophilic binding agent may preferably contain further polymers such as polyamide copolymers and/or polyvinylamine copolymers. The polymer may be used in a proportion of 0.4% to 5% by weight with respect to the mass of the pigment. In a preferred embodiment, the proportion of polymer is 0.5% to 1.5% by weight.

The layer containing the hydrophilic binding agent may be arranged directly on the front face of the base paper or on the back face of the base paper. It may be deposited on the base paper in a single layer or in multiple layers. The coating mass may be applied using any in-line or off-line coating units, the quantity being selected so that after drying, the coat weight per layer is a maximum of 20 g/m$^2$, in particular 8 to 17 g/m$^2$, or in a particularly preferred embodiment 2 to 6 g/m$^2$.

This further layer can be further smoothed using mechanical processes such as calendering or ferrotyping; however, it can also be deposited using cast coating.

In a particularly preferred embodiment of the invention, the base material is a base paper provided with at least one polymer layer on the front face or back face. The term "front face" as used here means that side of the base paper on which the conductive structure is printed.

In accordance with one embodiment of the invention, the polymer layers of the front and back face may contain the same polymer. In a further embodiment of the invention, the polymers employed in the polymer layers of the front and back face are different.

Preferably, the polymer layer arranged on at least one side of the base paper contains a polymer with a water vapour permeability of at most 150 g/m$^2$·24 h for a layer thickness of 30 μm, measured at 40° C. and 90% relative humidity.

The polymer is preferably a thermoplastic polymer. Examples of suitable thermoplastic polymers are polyolefins, in particular low density polyethylene (LDPE), high density polyethylene (HDPE), ethylene/α-olefin copolymers (LLDPE), polypropylene, polyisobutylene, polymethylpentene and blends thereof. However, other thermoplastic polymers such as (meth)acrylic acid ester homopolymers, (meth)acrylic acid ester copolymers, vinyl polymers such as polyvinyl butyral, polyamides, polyesters, polyacetals and/or polycarbonates may be employed.

In a preferred embodiment of the invention, the front face of the base paper is coated with a polymer layer which contains at least 50% by weight, in particular 80% by weight of a low density polyethylene with a density of 0.910 to 0.930 g/cm$^3$ and a melt-flow index of 1 to 20 g/10 min, with respect to the polymer layer.

In a further preferred embodiment of the invention, the back face of the base paper is coated with a polyolefin, in particular polyethylene. Particularly preferably, a polyethylene blend of LDPE and HDPE is used, wherein the LD/HD proportion is 9:1 to 1:9, in particular 3:7 to 7:3.

Furthermore, the polymer layers may contain white pigments such as titanium dioxide as well as other auxiliary substances such as optical brighteners, colorants and dispersing additives.

The coat weight of the polymer layers on the front face and back face may each be 5 to 50 g/m$^2$, preferably 20 to 50 g/m$^2$ or particularly preferably 30 to 50 g/m$^2$.

In a further embodiment of the invention, further layers such as protective layers or gloss-improving layers may be deposited on the outer microporous layer provided for printing with conductive particles using the inkjet printing process. The coat weight of such layers is preferably less than 1 g/m$^2$.

The following examples are intended to further illustrate the invention.

EXAMPLES

Fabrication of Base Paper

Eucalyptus cellular material was used to manufacture the base paper. For beating, the cellular material was beaten as an approximately 5% aqueous suspension (thick matter) using a refiner to a degree of beating of 36° SR. The mean fibre length was 0.64 mm. The concentration of cellular material fibres in the thin matter was 1% by weight, with respect to the mass of the cellular material suspension. The thin matter was supplemented with additional substances such as a neutral sizing agent, alkyl ketene dimer (AKD), in an amount of 0.48% by weight, a wet-strength agent, polyamine-polyamide epichlorhydrin resin (Kymene®), in a quantity of 0.36% by weight, and a natural $CaCO_3$ in a quantity of 10% by weight. The quantities given are with respect to the mass of cellular material. The thin matter, the pH of which was adjusted to approximately 7.5, was transferred from the headbox onto the screen of the paper machine, whereupon sheets were formed by dewatering the web in the screen portion of the paper machine. In the press section, the paper web was further dewatered to a water content of 60% by weight with respect to the web weight. Further drying was carried out in the dryer section of the paper machine using heated drying rollers. A base paper was obtained with a gsm substance of 160 g/m$^2$ and a moisture content of approximately 7%.

Support Example A (Comparison)

The base paper was coated on the front face and back face with a coating mass consisting of a styrene acrylate binding agent and a pigment mixture formed from calcium carbonate and kaolin with a coat weight of 30 g/m$^2$ (front face) and 20 g/m$^2$ (back face), then dried and subsequently smoothed using a calender.

Support Example B (Comparison)

The front face of the base paper was coated with a resin blend formed by 100% by weight of a low density polyethylene (LDPE, 0.923 g/cm$^3$) with a coat weight of approximately 20 g/m$^2$ in a laminator at a speed of approximately 250 m/min.

The back face of the base paper was coated with a resin blend formed by 100% by weight of a low density polyethylene (LDPE, d=0.923 g/m$^2$) at a coat weight of 20 g/m$^2$. Coating was carried out in a laminator at an extrusion speed of 250 m/min.

The front face of the support material was also treated by corona discharge and subsequently coated with a primer layer formed from a solution of polyvinyl alcohol (Mowiol® 04-98 from Kurarai) in water with a dry coat weight of 100 mg/m$^2$ then dried.

Support Example A1 (Invention)

Support Example A was coated with a coating mass having a solids content of 23% consisting of 80 parts boehmite pigment (Dispersal® HP14 from Sasol), 10 parts pyrogenic aluminium oxide pigment (Aeroxide® Alu C from Evonik Degussa), 8 parts polyvinyl alcohol (Mowiol® 40-88 from Kurarai) and 2 parts boric acid, then dried. The dry coat weight was 20 g/m$^2$; the mean pore size of the layer, measured using mercury porosimetry, was 30 nm.

Support Example B1 (Invention)

In the same manner as for support material Example A1, support Example B was provided with a microporous layer then dried. The dry coat weight was 30 g/m$^2$; the mean pore size of the layer, measured using mercury porosimetry, was 30 nm.

Support Example C1 (Invention)

In the same manner as for support material Example A1, a commercially available polyester film (Mylar®) of 125 μm thickness was corona treated and subsequently coated with a microporous layer and then dried. The dry coat weight was 30 g/m$^2$; the mean pore size of the layer, measured using mercury porosimetry, was 30 nm.

Test of Printing Properties

The support materials A, B, A1, B1, C1 and an uncoated commercially available polyester film (Mylar®) were printed with "NPS" type silver ink from Harima Chemicals, Inc, Japan, using a DMP-2800 inkjet printer from Fujifilm DIMATIX®. To this end, 25 mm long and 2 mm wide silver conductive strips were produced 25 mm apart and dried at room temperature for 1 hour.

The electrical resistance of the printed silver conductive strips was measured using a GDM-8251A electrical multimeter manufactured by GWINSTEK, Taiwan, at 23° C. and 50% relative humidity, as well as the electrical resistance between two adjacent printed conductive strips. In addition, the print quality, in particular the uniformity and contour definition of the print, was visually assessed with the aid of a DPM-100 microscope from Fibro Systems AB, Sweden.

The results are summarized in the table below.

| Support material | Conductive strip resistance | Resistance between adjacent conductive strips | Print quality*) |
|---|---|---|---|
| Film (comparison) | 600 ohm | >100 Mohm | o |
| A (comparison) | 480 ohm | 2 Mohm | − |
| B (comparison) | 580 ohm | >100 Mohm | o |
| A1 (invention) | 7 ohm | 50 Mohm | + |
| B1 (invention) | 9 ohm | >100 Mohm | + |
| C1 (invention) | 7 ohm | >100 Mohm | + |

*) Print quality: −: unsatisfactory; o: satisfactory; +: good.

It can be seen that the materials of the invention exhibit a low electrical resistance for the printed conductive strips, a high insulative resistance between the conductive strips and a good print quality.

The preferred embodiments of the invention as set forth herein are intended to be illustrative, not limiting. Various changes may be made without departing from the spirit and scope of the invention as defined herein and in the following claims.

We claim:

1. A support material used as a print medium for printing electronic circuits with the inkjet printing process using ink, wherein said ink has electrically conductive particles, wherein said print medium comprises flexible base material selected from paper, nonwoven and polymer film and an outer microporous layer arranged on at least one side of the base material, wherein the microporous layer has pores with a mean pore size of less than 100 nm and contains an inorganic pigment and a hydrophilic binding agent and wherein the inorganic pigment is aluminium oxide or aluminium oxide hydrate.

2. The support material of claim wherein the mean pore size of the layer is in the range of 5 nm to 50 nm.

3. The support material of claim 1, wherein the roughness of the surface of the microporous layer is less than 1 μm, measured as the Rz parameter in accordance with DIN 4768.

4. The support material of claim 1, wherein the microporous layer is present as foam.

5. The support material of claim 1, wherein at least one further layer is arranged between the base material and the microporous layer.

6. The support material of claim 5, wherein the further layer contains a hydrophilic binding agent and an inorganic pigment.

7. The support material of claim 5, wherein the further layer is a polyolefin layer.

8. A method for the production of an electronic circuit comprising the steps of printing with the ink jet printing process an electronic circuit on a support, said support comprising a flexible base material selected from paper, nonwoven and polymer film and an outer micropores layer arranged on at least one side of the base material, wherein the microporous layer has pores with a mean pore size of less than 100 nm and contains an inorganic pigment and a hydrophilic binding agent, wherein the inorganic pigment is aluminium oxide or aluminium oxide hydrate and where the ink used in the inkjet printing process is an ink that contains electrically conductive particles.

9. A printed circuit, comprising a support material formed from a flexible base material selected from paper, nonwoven and polymer film and a microporous layer arranged on the flexible base material, wherein the microporous layer has pores with a mean pore size of less than 100 nm and contains an inorganic pigment and as hydrophilic binding agent and wherein the inorganic pigment is aluminium oxide or aluminium oxide hydrate and the printed circuit is produced by printing the support material with an electrically conductive particle-containing printing ink by means of the inkjet printing process.

10. The support material of claim 2, wherein the roughness of the surface of the microporous layer is less than 1 μm, measured as the Rz parameter in accordance with DIN 4768.

11. A method of using support material as a print medium for printing electronic circuits with the inkjet printing process using ink containing electrically conductive particles, wherein said print medium comprises a flexible base material selected from paper, nonwoven and polymer film and an outer microporous layer arranged on at least one side of the base material, wherein the microporous layer has pores with a mean pore size of less than 100 nm and contains an inorganic pigment and a hydrophilic binding agent, wherein the inorganic pigment is aluminium oxide or aluminium oxide hydrate.

12. The method of using support material of claim 11, wherein the mean pore size of the layer is in the range of 5 nm to 50 nm.

13. The method of using support material of claim 11, wherein the roughness of the surface of the microporous layer is less than 1 μm, measured as the Rz parameter in accordance with DIN 4768.

14. The method of using support material of claim 11, wherein the microporous layer is present as a foam.

15. The method of using support material of claim 11, wherein at least one further layer is arranged between the base material and the microporous layer.

16. The method of using support material of claim 11, wherein the further layer contains a hydrophilic binding agent and an inorganic pigment.

17. The method of using support material of claim 11, wherein the further layer is a polyolefin layer.

* * * * *